United States Patent
Ranjan et al.

(10) Patent No.: US 11,205,576 B2
(45) Date of Patent: Dec. 21, 2021

(54) MONOLAYER FILM MEDIATED PRECISION MATERIAL ETCH

(71) Applicant: Tokyo Electron Limited, Tokyo (JP)

(72) Inventors: Alok Ranjan, Tomiya (JP); Peter Ventzek, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/658,149

(22) Filed: Jul. 24, 2017

(65) Prior Publication Data

US 2018/0025916 A1 Jan. 25, 2018

Related U.S. Application Data

(60) Provisional application No. 62/366,529, filed on Jul. 25, 2016.

(51) Int. Cl.
*H01L 21/311* (2006.01)
*H01L 27/06* (2006.01)

(52) U.S. Cl.
CPC ..... *H01L 21/31116* (2013.01); *H01L 27/0688* (2013.01)

(58) Field of Classification Search
CPC ............ H01L 21/31116; H01L 27/0688
See application file for complete search history.

(56) References Cited

U.S. PATENT DOCUMENTS

| | | | | |
|---|---|---|---|---|
| 2011/0163420 A1* | 7/2011 | Valdivia | ............. | H01L 21/0273 257/618 |
| 2013/0119018 A1* | 5/2013 | Kanarik | .................. | H05H 1/46 216/67 |
| 2014/0061870 A1* | 3/2014 | Chen | ..................... | H01L 29/401 257/635 |

OTHER PUBLICATIONS

Gong Xue-Yu et al. ,"Detection of NH2 Radical in Ammonia Radio-Frequency Plasmas by Laser-Induced Resonance Fluorescence", Chinese Physics Letters, 18 939, 2001.*
Ellen Fisher, "On the interplay between plasma ions, radicals and surfaces: who dominates the interaction?", Plasma Sources Sci. Technol. 11 (2002) A105-A112, 2002.*
Office Action dated Apr. 20, 2018 in corresponding Taiwan Patent Application No. 106124707 (with an English translation) (9 pages).

* cited by examiner

*Primary Examiner* — Thomas T Pham
(74) *Attorney, Agent, or Firm* — Rothwell, Figg, Ernst & Manbeck, P.C.

(57) ABSTRACT

A method of etching is described. The method includes treating at least a portion of a surface exposed on a substrate with an adsorption-promoting agent to alter a functionality of the exposed surface and cause subsequent adsorption of a carbon-containing precursor, and thereafter, adsorbing the organic precursor to the functionalized surface to form a carbon-containing film. Then, at least a portion of the surface of the carbon-containing film is exposed to an ion flux to remove the adsorbed carbon-containing film and at least a portion of the material of the underlying substrate.

22 Claims, 5 Drawing Sheets

MONOLAYER FILM MEDIATED PRECISION MATERIAL ETCH

CROSS-REFERENCE TO RELATED APPLICATIONS

This application is related to and claims priority to U.S. Provisional Patent Application Ser. No. 62/366,529 filed on Jul. 25, 2016, the entire contents of which are herein incorporated by reference.

FIELD OF INVENTION

The invention relates to a method for etching, and more particularly, a precision etch technique for etching a thin film for electronic device applications.

BACKGROUND OF THE INVENTION

The present invention relates to a method of manufacturing a semiconductor device such as an integrated circuit and transistors and transistor components for an integrated circuit. In the manufacture of a semiconductor device (especially on the microscopic scale), various fabrication processes are executed such as film-forming depositions, etch mask creation, patterning, material etching and removal, and doping treatments, are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other. As lateral dimensions densify and structures develop vertically, the need for precision material deposition and etch becomes more compelling.

SUMMARY

Techniques herein pertain to device fabrication using precision etch techniques.

A method of etching is described. The method includes treating at least a portion of a surface exposed on a substrate with an adsorption-promoting agent to alter a functionality of the exposed surface and cause subsequent adsorption of a carbon-containing precursor, and thereafter, adsorbing the organic precursor to the functionalized surface to form a carbon-containing film. Then, at least a portion of the surface of the carbon-containing film is exposed to an ion flux to remove the adsorbed carbon-containing film and at least a portion of the material of the underlying substrate.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

DETAILED DESCRIPTION

Techniques herein pertain to device fabrication using precision etch techniques. Several instances manifest in semiconductor manufacturing in both front end of line (FEOL, e.g., transistor fabrication) through to the back end of line (BEOL, e.g., interconnect fabrication), where oxide and nitride films (typically silicon-containing, in nature) need to be etched with a high degree of precision. Fluorocarbon based plasmas are used ostensibly because carbon removes the oxygen and fluorine volatilizes silicon. In fact the etch is mediated by a F—C—(O or N)—Si mixing layer as the fluorocarbon forms a film which is checked in its growth by, among other influences, ion bombardment.

Absent ion sputtering of the film, it grows potentially in a continuous manner as a thin film. Simply put, it is also the thickness of the film that plays a role in requiring large ion energies from the plasma to etch dielectrics. The ions must penetrate the film to supply energy to the film-virgin substrate interface, where the etching reaction (SiX+C+F→ (creates) volatile products, 'X' is an element other than Si) originates. Managing this mixing layer is a major challenge in many fabrication modules, as clogging can result at different feature openings and the film thickness, which may play a role in the selectivity between different films being etched (e.g., nitride and oxide), may be difficult to manage over different feature shapes, distributions or within the feature geometry itself. Self-aligned, high aspect ratio structures and patterning applications all suffer from the integration challenge of finding the optimal mix of polymerizing, etch precursor ion and energy flux to overcome the myriad of trade-offs that come from uncontrolled polymer growth.

Atomic layer etching should offer a solution; however, fluorocarbon plasmas deposit fluorocarbon films that are not self-limited. The thickness of the films that would be removed in a subsequent ion bombardment step can only be attempted to be controlled by exposure time and possibly ion energy. Control within a complex structure, through its increasing depth, is difficult as fluorocarbon fluxes change due to shadowing (analogous to ARDE or aspect ratio dependent etch in a continuous process), and are further complicated by iso-dense structural differences. Atomic layer etching of oxide and nitride materials, using fluorocarbon based plasmas, is often referred to as quasi-ALE because it is in fact not ALE as the fluorocarbon film is not self-limited.

Figure 3:
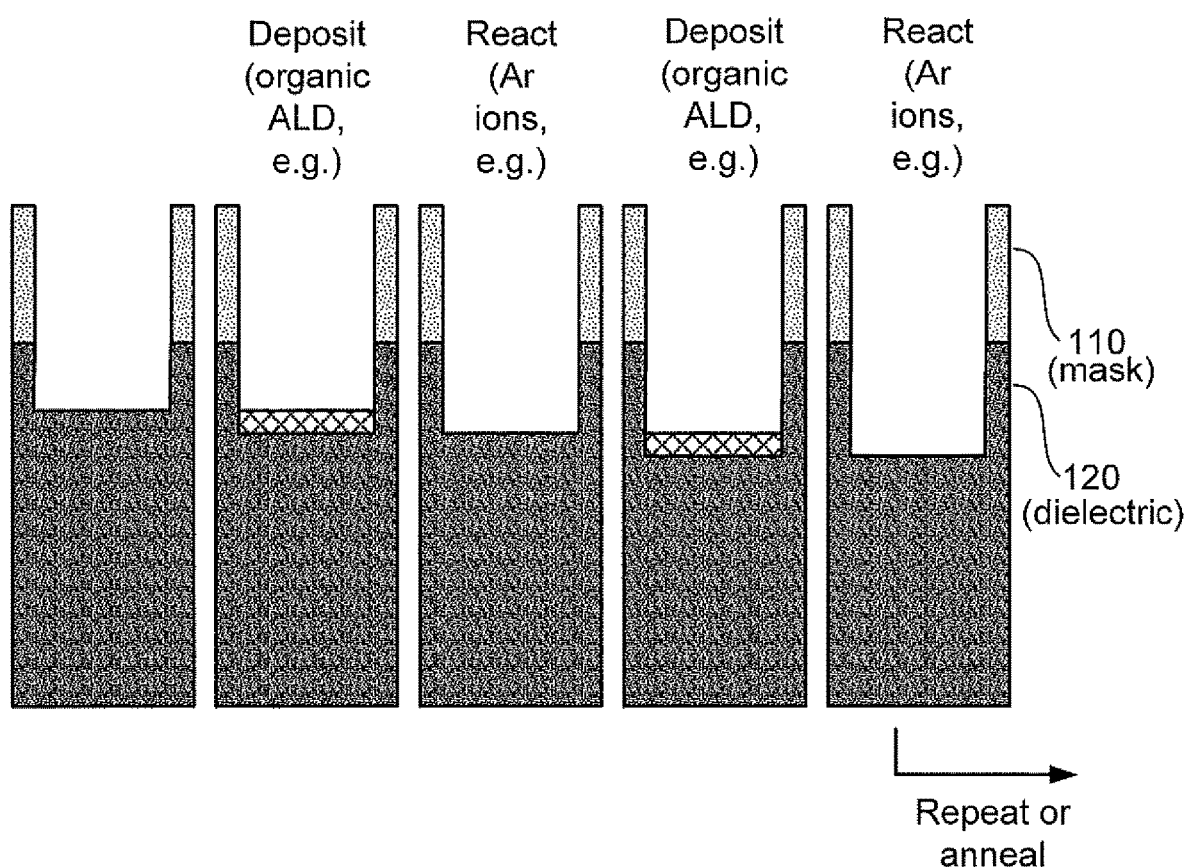
FIG. 3 illustrates a method of etching a substrate according to an embodiment.

In one embodiment, a carbon-containing film, preferably a monolayer film, is placed on at least a portion of a substrate, including exposed regions of silicon oxide and/or silicon nitride, during an adsorption step. Thereafter, the adsorbed film, including some of the underlying material (e.g., oxide or nitride) is removed by an ion bombardment mediated desorption step (see FIGS. 3 and 5). Organic films or carbon-containing films of prescribed thickness can be deposited using atomic layer deposition. And by doing so, the problem of carbon-containing films of uncontrolled thickness as etch mediating layers in continuous and layer-by-layer etching can be solved.

Figure 1:
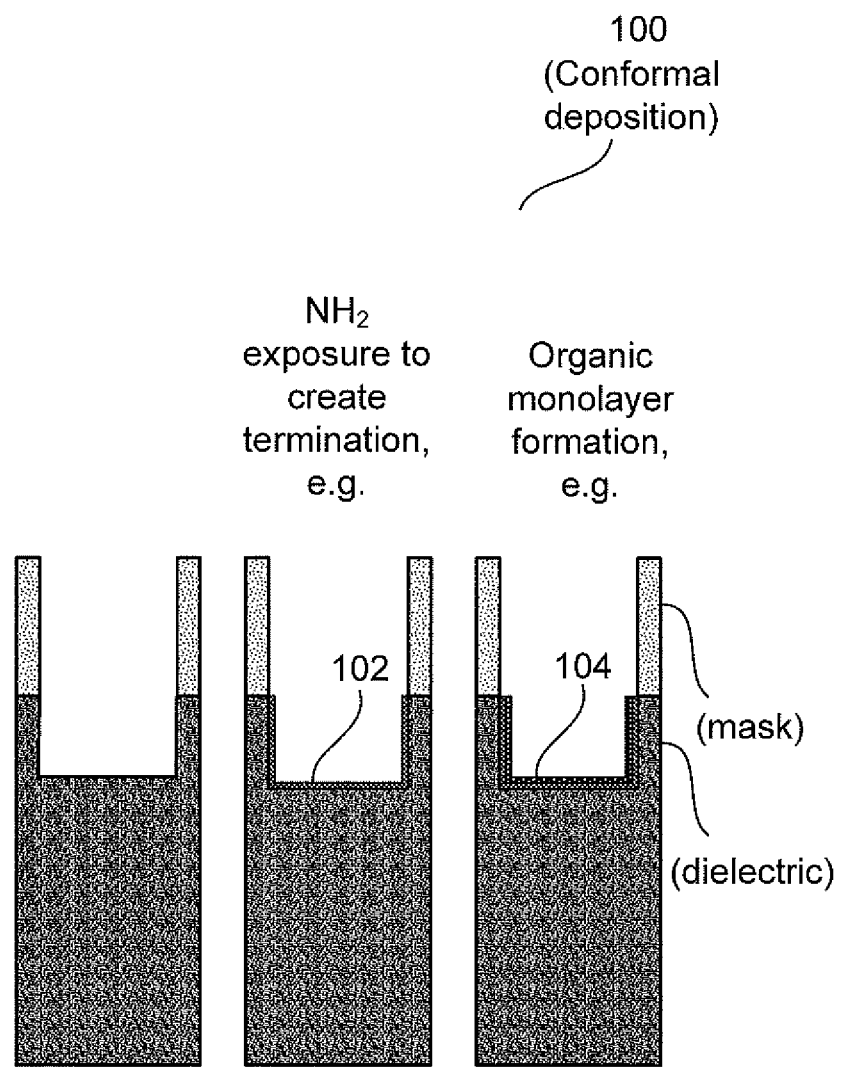
FIG. 1 illustrates a method of conformal adsorption of a thin film on a substrate according to an embodiment.
Figure 2:
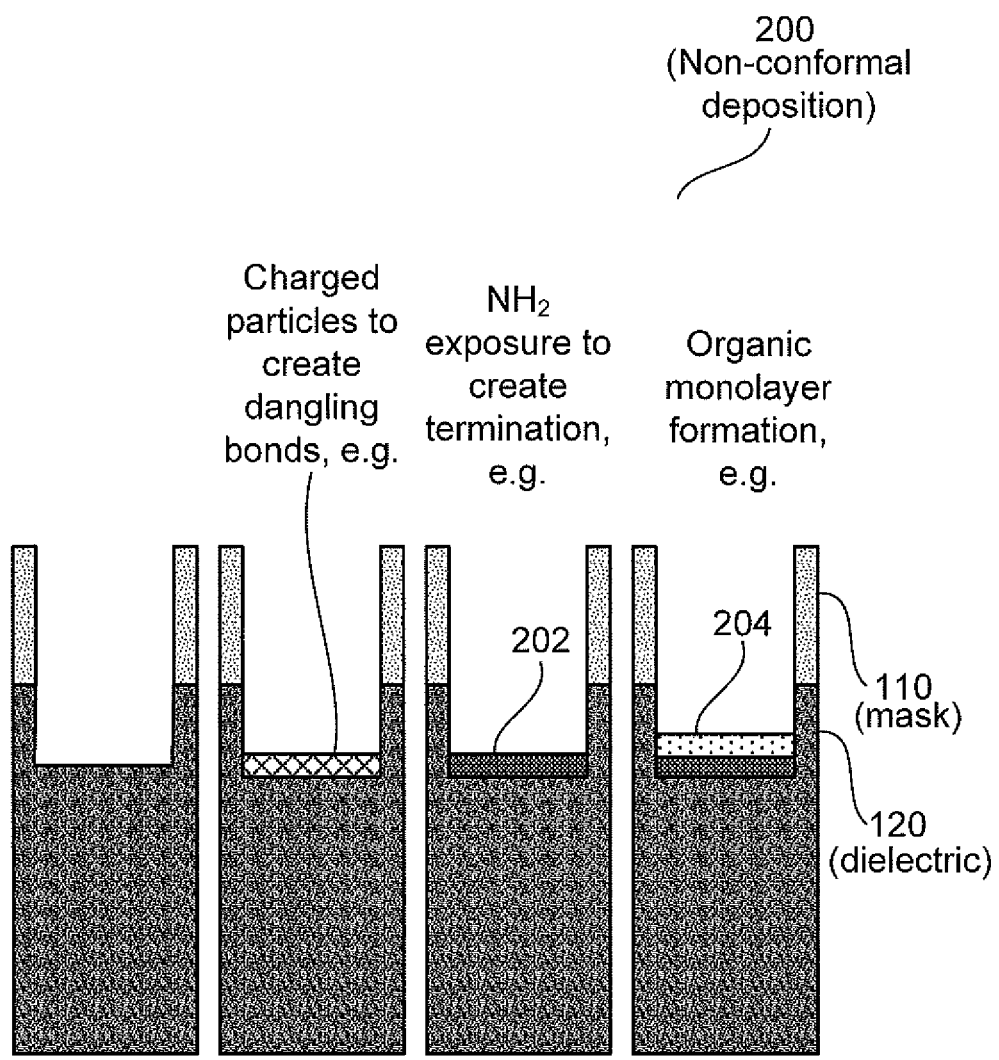
FIG. 2 illustrates a method of non-conformal adsorption of a thin film on a substrate according to an embodiment.

In a conformal deposition flow 100 for a substrate having a mask 110 and a material layer 120 (dielectric, e.g.), the atomic layer deposition of a carbon-containing film comprises pre-treating the exposed surface with an adsorption promoting agent 102 to alter the surface functionality of the exposed surface (i.e., "functionalize" the surface) so that a carbon-containing or polymer precursor 104 can chemisorb to the functionalized surface (see FIGS. 1 and 2). Without limitation, approximately one layer of a stoichiometric film is the result. The film may be fluorine-containing or treated with fluorine, e.g., $F_2$, a fluorine gas, or non-polymerizing plasma to create a fluorocarbon based layer.

Following a purge step that evacuates the precursor gases from the chamber, the substrate is exposed to an ion flux, such as the ion flux from an inert plasma (e.g., an argon (Ar) plasma), and ion bombardment at an energy above the etching threshold and below the sputtering threshold is performed. One of such described cycle constitutes a layer-by-layer removal of dielectric material. A layer may be one or more equivalent molecular layer thicknesses, as required by an application; see FIG. 5 for an exemplary flow chart.

Figure 4:
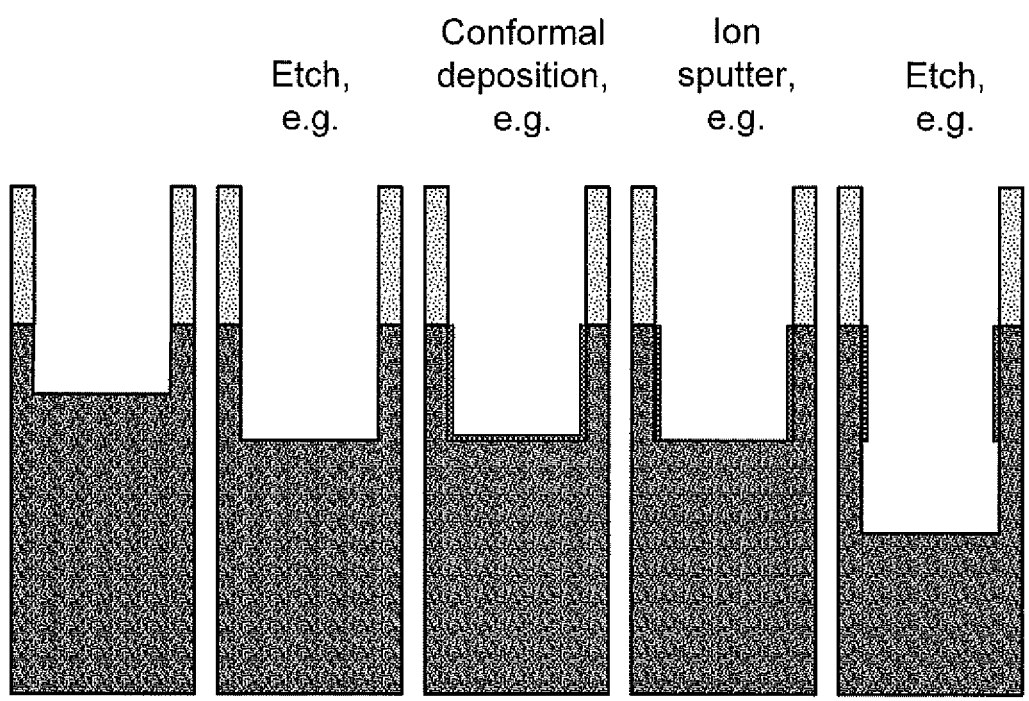
FIG. 4 illustrates a method of etching a substrate according to an embodiment.

Furthermore, the ALD deposited film can serve as passivation of the sidewall of a structure being etched (see FIG. 1 and FIG. 4). Excess film may be removed with a flash processing step (i.e., short process time, less than 10 seconds, e.g. an oxygen step, each cycle were it desirable.

In some embodiments, charged particle bombardment may be used to prepare a surface for film growth (see FIG. 2). When it is desirable to grow a film only on horizontal surfaces, electrons or ions can be used to create dangling bonds to stimulate growth on those surfaces (see FIG. 2). Less flux to the sidewalls or vertical structures allows delayed growth on the sidewalls taking advantage of incubation times or the natural delay of nucleation on un-wettable surfaces.

Differences in nucleation time between different materials allow one to choose adsorption times to create selectivity between different materials. For example, a fill monolayer may be grown on a nitride and less than a monolayer may be grown on and oxide for short adsorption times. Longer adsorption times can be chosen for full coverage of both materials should that be desirable. Selectivity is then achieved through ion energy selection.

A preferred method for promoting adsorption of the carbon-containing material 204 includes exposing the surface to an ammonia plasma so that the surface is occupied by reactive —$NH_2$ bonds, an adsorption-promoting agent 202. Rendering the surface functionalizable by —$NH_2$ may require pretreatment by a halogen material. However, ion bombardment from an inert gas plasma alone is often sufficient to create the dangling bonds to receive $NH_2$ radicals. The $NH_2$ groups on the surface are then reactive with organic material or polymer precursors. This exposure step can be plasma free.

In other embodiments, the carbon-containing film can be exposed to fluorine to alter the fluorine to carbon ratio in the film. The fluorine exposure may include gas-phase chemistries with or without plasma formation.

Material removal is then performed during ion bombardment with low and controlled energy ions. The formation of ion flux may be achieved in a 13.56 MHz capacitively coupled plasma (e.g., power ranging from 5-25 W) at a chamber pressure of 100-500 mTorr, or a spatially segregated plasma at high pressure, such as a surface wave driven microwave source (e.g., power ranging from 1000-2000 W) with equivalently low bias power.

The treating, adsorbing, and exposing steps may be repeated to remove a pre-determined amount of material from the substrate. These steps, and others, may be performed in the same process chamber, or separate chambers. Each process step can include gas-phase chemistry, and be performed at vacuum pressures.

Figure 5:
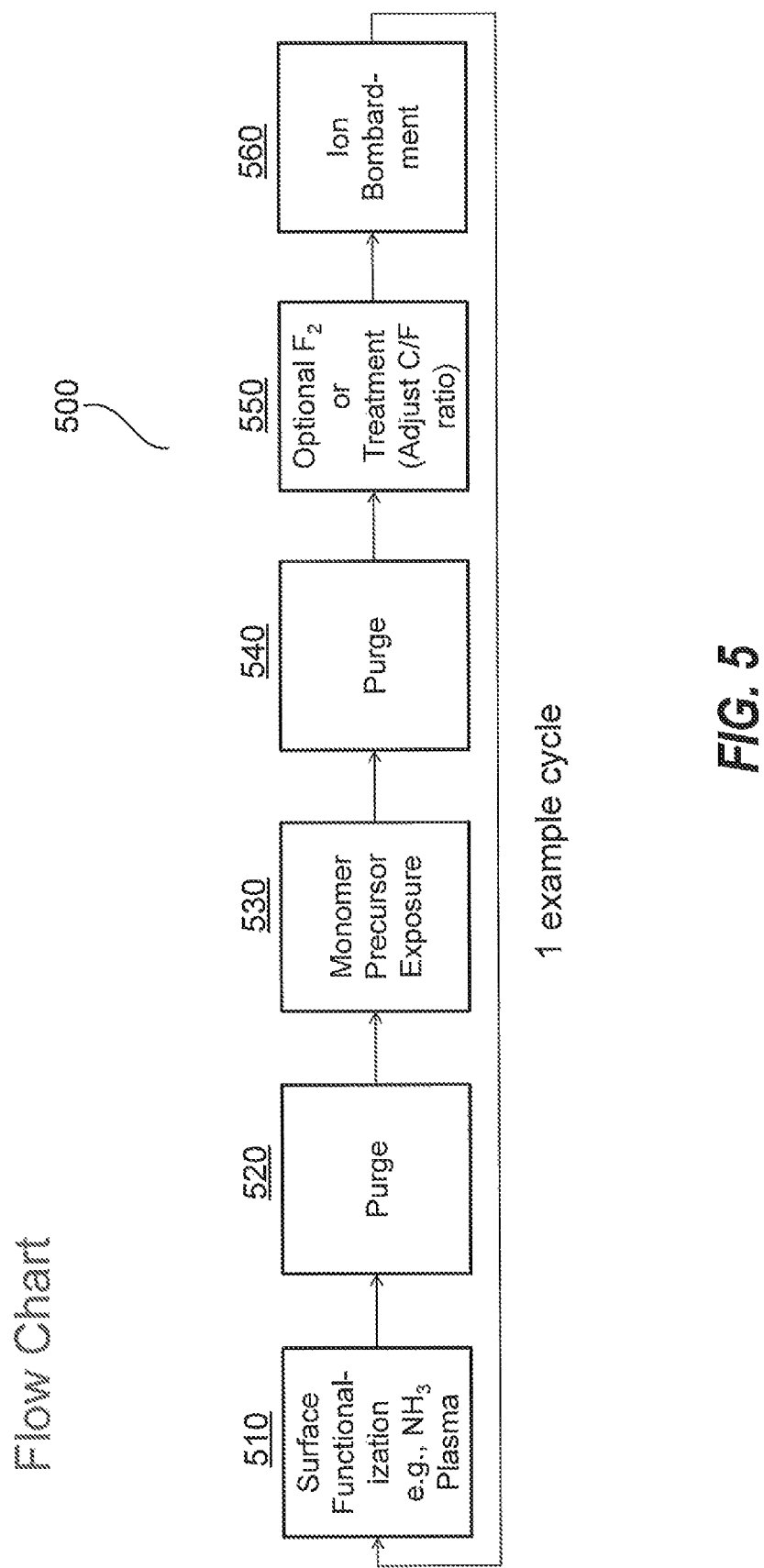
FIG. 5 provides a flow chart illustrating a method of etching a substrate according to an embodiment.

FIG. 5 illustrates exemplary steps in a process flow 500. The exemplary steps can include (1) a surface functionalization (e.g., ammonia plasma) (510), (2) a purge (520), (3) a monomer precursor exposure (330), (4) a purge (540), (5) an optional fluorine (e.g., $F_2$ or treatment using C/F with C-to-F ratio adjustment) (550), and (6) an ion bombardment (560).

In the claims below, any of the dependents limitations can depend from any of the independent claims.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of etching, comprising:
providing a substrate that includes a mask and a material layer with an exposed surface which is exposed at a bottom of an opening defined by the mask;
creating dangling bonds by forming a pre-treated surface, wherein forming the pre-treated surface comprises pre-treating the exposed surface of the material layer at the bottom of the opening with a pre-treatment charged particle flux, wherein the created dangling bonds render the pre-treated surface more reactive to $NH_2$ as compared to the exposed surface of the material layer before the pre-treatment;
after forming the pre-treated surface, treating at least a portion of the pre-treated surface of the material layer at the bottom of the opening with an adsorption-promoting agent comprising $NH_2$ and thereby increasing adsorption of the pre-treated surface to a carbon-containing precursor and forming a functionalized surface, wherein the treating with $NH_2$ comprises using an ammonia-based plasma to form $NH_2$ and reacting the $NH_2$ with the dangling bonds formed during forming of the pre-treated surface and $NH_2$ groups are present on the functionalized surface at the bottom of the opening after the increasing adsorption;
after increasing adsorption and forming the functionalized surface by treating with $NH_2$, exposing the functionalized surface to the carbon-containing precursor such that the carbon-containing precursor reacts with the $NH_2$ groups on the functionalized surface at the bottom of the opening and the carbon-containing precursor is adsorbed to the functionalized surface and thereby forms a carbon-containing film which includes material both from the carbon-containing precursor and from the material layer; and
after exposing the functionalized surface to the carbon-containing precursor, exposing at least a portion of the surface of the carbon-containing film at the bottom of the opening to an ion flux and thereby removing the carbon-containing film which includes material both from the carbon-containing precursor and from the material layer,
wherein the exposing the functionalized surface to the carbon-containing precursor to form the carbon-containing film includes performing an atomic layer disposition (ALD) to form the carbon-containing film.

2. The method of claim 1, wherein the substrate comprises silicon, germanium, or a silicon-germanium alloy.

3. The method of claim 1, wherein the pre-treatment charged particle flux includes an ion flux from an inert gas plasma.

4. The method of claim 1, wherein the carbon-containing precursor includes a —CH containing precursor, or a monomer precursor.

5. A method according to claim 4, further including, etching a feature in the material layer prior to forming the functionalized surface, and the etched feature is treated with the adsorption-promoting agent.

6. The method of claim 1, further comprising:
after exposing the functionalized surface to the carbon-containing precursor and prior to exposing at least a portion of the surface of the carbon-containing film to an ion flux, exposing the carbon-containing film to a fluorine-containing material to adjust the fluorine to carbon content of the carbon-containing film.

7. The method of claim 1, further comprising:
repeating the treating, adsorbing, and removing steps to remove multiple layers of material.

8. The method of claim 1, further comprising:
purging the environment following the treating step and preceding the adsorbing step.

9. The method of claim 1, further comprising:
purging the environment following the adsorbing step and preceding the removing step.

10. The method of claim 1, wherein the carbon-containing precursor includes fluorine, and the carbon-containing film includes carbon and fluorine from the carbon-containing precursor and silicon from the material layer.

11. The method of claim 10, further comprising:
after exposing the functionalized surface to the carbon-containing precursor and prior to exposing at least a portion of the surface of the carbon-containing film to an ion flux, exposing the carbon-containing film to a fluorine-containing material to adjust the fluorine to carbon content of the carbon-containing film.

12. The method of claim 1, wherein the carbon-containing film includes carbon from the carbon-containing precursor and silicon from the material layer, and wherein the carbon-containing film further includes at least one of oxygen or nitrogen from the material layer.

13. The method of claim 12, further comprising:
after exposing the functionalized surface to the carbon-containing precursor and prior to exposing at least a portion of the surface of the carbon-containing film to an ion flux, exposing the carbon-containing film to a fluorine-containing material to adjust the fluorine to carbon content of the carbon-containing film.

14. The method of claim 1, wherein the material layer includes a dielectric material exposed at the bottom of the opening prior to the step of creating dangling bonds, and a portion of the dielectric material is removed during the exposing and thereby removing.

15. The method of claim 14, wherein the exposing and thereby removing includes using a capacitively coupled plasma of a power of 5-25 W or using a plasma formed with a microwave source at a power of 1000-2000 W, to etch and remove material both from the carbon-containing precursor and from the material layer.

16. The method of claim 1, wherein the exposing and thereby removing includes using a capacitively coupled plasma of a power of 5-25 W or using a plasma formed with a microwave source at a power of 1000-2000 W, to etch and remove material both from the carbon-containing precursor and from the material layer.

17. The method of claim 1, wherein
the exposed surface of the material layer comprises silicon oxide and/or silicon nitride, and
the exposing of said at least the portion of the surface of the carbon-containing film to the ion flux removes an oxide and/or a nitride.

18. The method of claim 1, wherein the creating the dangling bonds includes treating the material layer with a halogen and subjecting the material layer to an inert plasma;

wherein the exposing at least a portion of the carbon-containing film at the bottom of the opening to an ion flux includes using an argon plasma; and the method further comprising, after the treating with NH$_2$ and before exposing the functionalized surface to the carbon-containing precursor, purging a chamber within which the method is performed.

19. A method of etching, comprising:

providing a substrate that includes a mask and a material layer with an exposed surface which is exposed at a bottom of an opening defined by the mask, wherein the material layer includes a silicon oxide, a silicon nitride or a dielectric exposed at the bottom of the opening, creating dangling bonds by forming a pre-treated surface on the exposed surface of the material layer at the bottom of the opening, wherein the created dangling bonds render the pre-treated surface more reactive to NH$_2$ as compared to the exposed surface of the material layer before the pre-treatment, the creating of the dangling bonds comprises at least one of a halogen pre-treatment or an inert plasma pre-treatment;

after forming the pre-treated surface, treating at least a portion of the pre-treated surface of the material layer at the bottom of the opening with an adsorption-promoting agent comprising NH$_2$ and thereby increasing adsorption of the pre-treated surface to a carbon-containing precursor and forming a functionalized surface, wherein the treating with NH$_2$ comprises using an ammonia-based plasma to form NH$_2$ and reacting the NH$_2$ with the dangling bonds formed during forming of the pre-treated surface and NH$_2$ groups are present on the functionalized surface at the bottom of the opening after the increasing adsorption;

a first purging of a chamber in which the method is performed, the first purging being after the increasing adsorption;

after increasing adsorption and forming the functionalized surface by treating with NH$_2$ and after the first purging, exposing the functionalized surface to the carbon-containing precursor such that the carbon-containing precursor reacts with the NH$_2$ groups on the functionalized surface at the bottom of the opening and the carbon-containing precursor is adsorbed to the functionalized surface and thereby forms a carbon-containing film which includes material both from the carbon-containing precursor and from the material layer;

after exposing the functionalized surface to the carbon-containing precursor, performing a second purging of the chamber; and after exposing the functionalized surface to the carbon-containing precursor and after the second purging, exposing at least a portion of the surface of the carbon-containing film at the bottom of the opening to an ion flux and thereby removing the carbon-containing film which includes material both from the carbon-containing precursor and from the material layer, wherein the exposing the functionalized surface to the carbon-containing precursor to form the carbon-containing film includes performing an atomic layer disposition (ALD) to form the carbon-containing film.

20. The method of claim 19, further comprising after the second purging and before the exposing to the ion flux, performing a treatment of the carbon-containing film with a gas comprising fluorine.

21. The method of claim 20, wherein the material layer exposed at the bottom of the opening during creating of the dangling bonds is a dielectric; and wherein the exposing to an ion flux and thereby removing comprises using an inert plasma comprising argon.

22. The method of claim 19, wherein the material layer exposed at the bottom of the opening during creating of the dangling bonds is a dielectric; and wherein the exposing to an ion flux and thereby removing comprises using an inert plasma comprising argon.

* * * * *